United States Patent [19]
Fu et al.

[11] Patent Number: 6,007,684
[45] Date of Patent: *Dec. 28, 1999

[54] PROCESS FOR FORMING IMPROVED TITANIUM-CONTAINING BARRIER LAYERS

[75] Inventors: Jianming Fu, Sunnyvale; Fusen Chen, Cupertino, both of Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/967,128

[22] Filed: Nov. 12, 1997

Related U.S. Application Data

[62] Division of application No. 08/482,379, Jun. 7, 1995, Pat. No. 5,858,184.

[51] Int. Cl.$^6$ .......................... C23C 14/34; H01L 21/441
[52] U.S. Cl. ................. 204/192.17; 204/192.15; 438/643; 438/648; 438/653; 438/656; 438/685; 438/688
[58] Field of Search ......................... 204/192.15, 192.17; 438/643, 648, 653, 656, 685, 688

[56] References Cited

U.S. PATENT DOCUMENTS

| | | | |
|---|---|---|---|
| 5,232,871 | 8/1993 | Ho | 437/190 |
| 5,290,731 | 3/1994 | Sugano et al. | 437/190 |
| 5,341,026 | 8/1994 | Harada et al. | 257/764 |
| 5,371,042 | 12/1994 | Ong | 437/192 |
| 5,378,660 | 1/1995 | Ngan et al. | 437/247 |

FOREIGN PATENT DOCUMENTS

| | | | |
|---|---|---|---|
| 12753332 | 10/1988 | Canada | H01L 23/48 |
| 1275332 | 10/1990 | Canada . | |
| 0 545 602 | 6/1993 | European Pat. Off. | 437/190 |
| 680077 | 4/1994 | European Pat. Off. | H01L 21/285 |
| 747499 | 6/1995 | European Pat. Off. | C23C 14/06 |
| 747500 | 6/1995 | European Pat. Off. | C23C 14/06 |
| 1955716 | 11/1969 | Germany . | |
| 01111666 | 4/1989 | Japan | H01L 21/285 |
| 03358193 | 12/1991 | Japan | C23C 14/34 |
| 5-36627 | 2/1993 | Japan | 437/192 |
| 5-121356 | 5/1993 | Japan | 437/190 |

OTHER PUBLICATIONS

Hoshino Translation of Japan 5–36627, Feb. 1993.

Brett et al, High rate planar magnetron deposition of transparent, conducting and heat reflecting films on glass and plastic:, J. Vac. Sci. Technol. A1(2) Apr.–Jun. 1983, pp.352–355.

Dixit et al, "Reactively sputtered titanium nitride film for submicron contact barrier metallization", Appl. Phys. Lett. 62(4) Jan. 25, 1993, pp. 357–359.

Liao et al, Ti/TiN Barrier Enhancement for Aluminum Plug Interconnect Technology:, VMIC Conf, 1994, ISMIC–103/94/0428 pp. 428–434.

*Primary Examiner*—Nam Nguyen
*Assistant Examiner*—Rodney G McDonald
*Attorney, Agent, or Firm*—Birgit Morris

[57] ABSTRACT

An improved titanium nitride barrier layer that prevents spiking between an overlying aluminum layer and a silicon substrate is formed by first sputter depositing a titanium layer onto the substrate, forming an oxygen-containing titanium layer thereover, and sputter depositing a titanium nitride layer over the oxygen-containing layer. The oxygen-containing layer can be formed in an oxygen-containing plasma, or titanium can be sputtered in the presence of oxygen. The titanium-containing layers can be deposited in a single sputtering chamber fitted with a source of RF power to the substrate support to form the plasma. An aluminum contact layer is sputter deposited over the titanium nitride layer.

12 Claims, 2 Drawing Sheets

PROCESS FOR FORMING IMPROVED TITANIUM-CONTAINING BARRIER LAYERS

This is a division of application Ser. No. 08/482,379 filed Jun. 7, 1995 now U.S. Pat. No. 5,858,184.

This invention relates to a process for the deposition of improved titanium/titanium nitride barrier layers prior to aluminum contact deposition.

BACKGROUND OF THE INVENTION

Titanium nitride is a known barrier material used to prevent spiking of aluminum contacts into a silicon substrate. Titanium nitride can be deposited by sputtering titanium in the presence of argon and nitrogen gas. It is also known to enhance the barrier properties of titanium nitride by annealing or incorporating oxygen into the film. The oxygen fills the spaces between the grain boundaries of the titanium nitride. The annealing can be done in a Rapid Thermal Anneal (RTA) chamber or by heating in a nitrogen atmosphere containing oxygen. This is known as "stuffing" the titanium nitride layer. A layer of aluminum is deposited over the stuffed titanium nitride layer, also generally by sputtering. The aluminum layer can be heated then at temperatures above the flow temperature of aluminum to ensure that contact openings are completely filled.

As substrate wafer sizes become larger and devices made in the wafers become smaller and are placed closer together, many problems have arisen in filling small openings with material in a conformal manner that avoids the formation of voids. As the aspect ratio (width to depth ratio of openings) becomes higher, it becomes more difficult to fill openings, particularly by sputtering.

In an effort to improve the conformality of Ti/TiN sputtered deposits, a collimator can be used in the sputtering chamber. This permits only vertically directed sputtered species to pass through the collimator to the substrate, thereby improving the conformality of the deposited films.

Liao et al disclosed an RTA treatment of a sputtered, low density titanium/titanium nitride stack, which formed a TiON layer at the titanium/titanium nitride interface. Their suggested process requires sputtering 550 Å of titanium followed by sputtering 500 Å of titanium nitride. The wafers are exposed to air and heated at 650° C. in an RTA chamber after oxygen exposure of the titanium/titanium nitride stack. However, this process, although improving the barrier properties of the titanium/titanium nitride stack, requires a break in the vacuum after sputtering the titanium/titanium nitride layers to perform the oxygen exposure and RTA steps prior to sputter deposition of the overlying aluminum contact.

The above process works well, but requires extra oxygen exposure and annealing steps that reduce throughput, particularly for single wafer processing. Further, this process does not completely eliminate aluminum spiking. Thus the effort to improve titanium-containing barrier layers to prevent aluminum spiking through the layers to the substrate has continued.

SUMMARY OF THE INVENTION

We have found that oxygen stuffing of titanium nitride layers is not sufficient to eliminate spiking by an overlying aluminum layer. The present process forms an oxygenated titanium layer after deposition of a first sputtered titanium layer. Such a layer can be formed by post treatment of the titanium layer using an oxygen plasma; or by sputtering a titanium target in the presence of oxygen or a mixture of oxygen and nitrogen, or both, to form a TiO$_2$ or a TiON layer over the titanium layer. This step is followed by sputter deposition of a titanium nitride layer. This in-situ process produces an improved barrier against spiking of an overlying aluminum layer through the barrier layer, and provides improved throughput.

DETAILED DESCRIPTION OF THE INVENTION

In accordance with the process of the invention, a first titanium layer is sputter deposited in argon onto a substrate, usually a silicon wafer, in a sputtering chamber fitted with a DC power source connected to a titanium target. This titanium layer is generally deposited at a high DC power of 10,000–12,000 watts, whereby titanium is deposited at a deposition rate of about 1000 Å/min. A source of RF power is connected to the substrate support. After deposition of this first Ti layer, an oxygen=containing gas, such as mixtures of oxygen and argon that can also contain nitrogen, is flowed into the chamber and the RF power is turned on to create a plasma of the plasma precursor gases in the sputtering chamber. The generated oxygen plasma will form a layer of TiO$_x$ or TiO$_x$N$_y$ when nitrogen is added.

In a second embodiment, in addition to the RF power applied, a low DC power of about 500 watts is also applied to the target. The titanium is sputtered in the presence of an oxygen plasma at a low deposition rate. This also forms a thin (about 20 Å thick) titanium oxide or titanium oxynitride layer over the first titanium layer.

In another embodiment, the second embodiment is followed except that no RF power is applied. This process also forms a thin layer of titanium oxide or titanium oxynitride over the first titanium layer.

Thus the plasma deposition process is controlled by adjusting the DC and RF power supplies, and by adjusting the gas flows and gas flow rates.

The process is continued by shutting off the RF power and continuing to deposit titanium nitride by sputtering titanium in the presence of nitrogen, generally nitrogen and argon, in known manner.

The oxygen plasma is discontinued when an oxide layer up to about 20 Å in thickness is formed. This thin oxide layer does not adversely affect the resistance of the titanium nitride layer or the resistance of the aluminum contact but does improve the robustness of the barrier layer.

Figure 1:
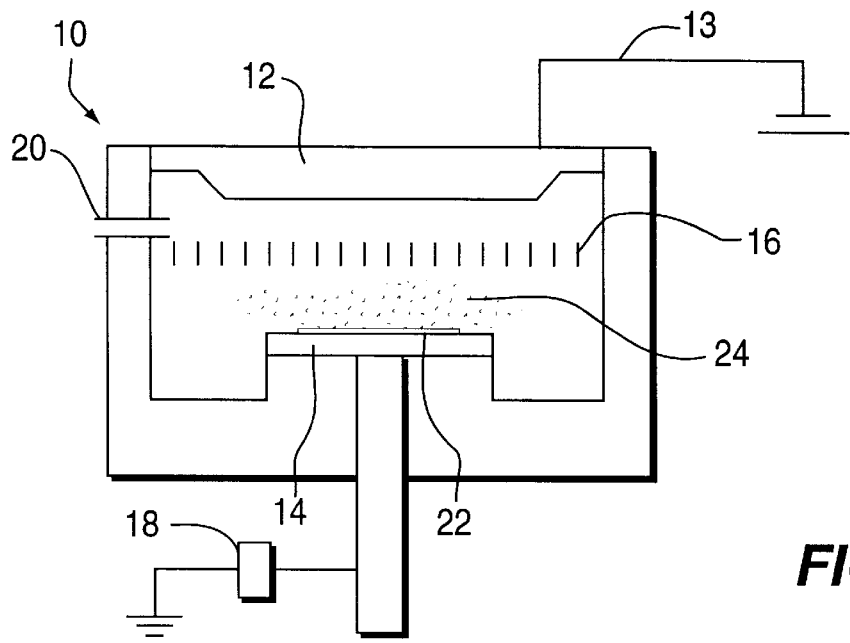
FIG. 1. is a cross sectional schematic view of a sputtering chamber in which the present process can be carried out.

FIG. 1 is a schematic view of a conventional sputtering chamber modified to permit formation of an oxygen plasma during deposition of a titanium/titanium nitride barrier layer. The chamber 10 includes a titanium target 12 connected to a DC power source 13 and a substrate support 14. A collimator 16 is mounted between the target 12 and the substrate support 14. A source of RF power 18 is connected to the substrate support 14. A gas inlet manifold 20 permits various gases to be controllably passed into the chamber. During processing, a substrate 22 is mounted on the substrate support 14.

To carry out the present deposition process, a substrate is provided having a plurality of exposed openings in which aluminum contacts are to be formed. After mounting the substrate 22 onto the substrate support 14, a flow of argon is started in the chamber, whereupon titanium is sputtered onto the substrate 22. The DC power is adjusted and the RF power is initiated to the substrate support 14 and oxygen is flowed into the chamber, whereupon an oxygen plasma is created in a plasma region 24 above the surface of the substrate 22 and below the collimator 16. The flow of oxygen is stopped, and a flow of argon and nitrogen is begun. Titanium is then sputtered in the presence of nitrogen so that a layer of titanium nitride is deposited over the oxygen-containing titanium layer.

Aluminum is deposited thereover, generally in a separate sputtering chamber, to fill the contact openings in the substrate 22. If the aluminum is deposited in the same chamber, the titanium target 12 must be replaced by an aluminum target. However, this method is less preferred since the vacuum in the sputtering chamber must be broken to replace the target. Preferably, the titanium/titanium nitride coated substrate is transferred to a second sputtering chamber to sputter the aluminum.

After deposition of aluminum, the contact is tested by heating at about 550° C. for one hour, and the contact inspected for aluminum spiking through the barrier layers.

Figure 2:
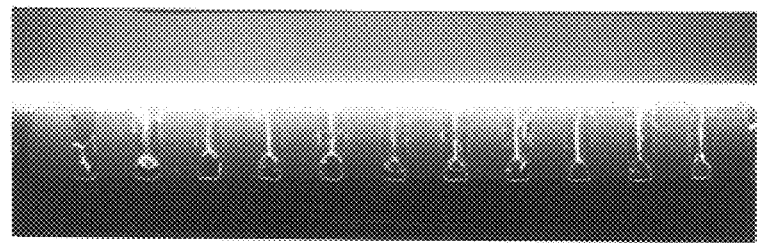
FIG. 2 is a photomicrograph of contacts made in accordance with the process of the invention.

FIG. 2 is a photomicrograph of the deposition stack formed in accordance with the invention after a spike test was conducted. FIG. 2 shows that every opening in the substrate is completely filled and that no spiking occurred in any of the eight contacts shown.

Figure 3:
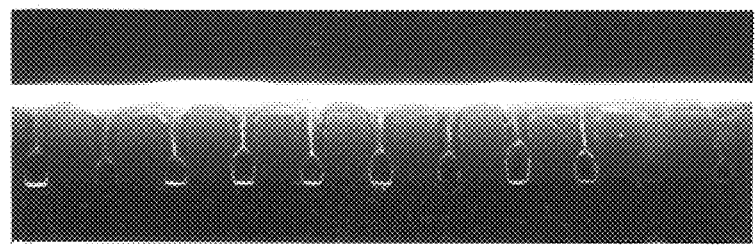
FIG. 3 is a photomicrograph of contacts made in accordance with a prior art process.

As a first control, a contact comprising a first titanium layer was sputter deposited on a substrate, an overlying titanium nitride layer was formed as above, a third titanium layer was sputter deposited over the titanium nitride layer and a final aluminum layer were deposited. No oxygen was present in the chamber during these depositions. FIG. 3 shows that all of the contacts had spiked through to the substrate.

Figure 4:
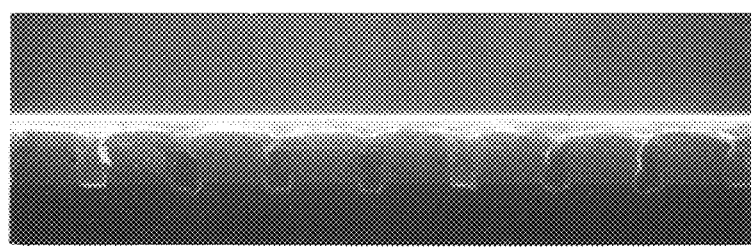
FIG. 4 is a photomicrograph of contacts made in accordance with another prior art process.

In a second control, a layer of titanium was deposited followed by deposition of a titanium nitride layer. This titanium nitride layer was exposed to an oxygen plasma after about half of the layer was deposited. A final barrier layer of a thin titanium layer was deposited, followed by deposition of an aluminum layer. FIG. 4 shows that spiking occurred in most of the contacts.

Figure 5:
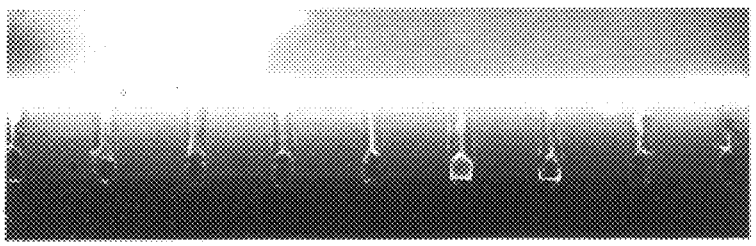
FIG. 5 is a photomicrograph of contacts made in accordance with still another prior art process.

In a third control, a titanium/titanium nitride deposited bilayer was exposed to oxygen plasma after all of the titanium nitride layer was deposited, followed by deposition of the final titanium layer and an aluminum layer. FIG. 5 shows that aluminum spiking occurred through the titanium/titanium nitride/titanium barrier layers.

It is believed the oxygen plasma treatment of a titanium layer, followed by deposition of titanium in nitrogen, forms an oxygenated titanium layer that can be titanium oxide, or a TiON layer, or a combination thereof. We believe it is the oxygenated titanium layer formed during oxygen plasma treatment that provides improved barrier properties. The amount of oxygen present at the Ti/TiN interface must be sufficient to provide good barrier properties, but not enough to reduce the contact resistance of the contacts. The amount of oxygen can be controlled by adding some oxygen, or oxygen and nitrogen, during the sputter deposition of titanium, and by adding more or less argon during the oxygen plasma treatment to dilute the oxygen. Some nitrogen can also be introduced during the oxygen plasma treatment step to further control the amount of titanium oxide at the Ti/TiN interface. If the titanium oxide layer is deposited to a thickness of no more than about 20 Å, the sheet resistance of an overlying titanium nitride layer, and the contact resistance, will not be reduced below a desired level.

Figure 6:
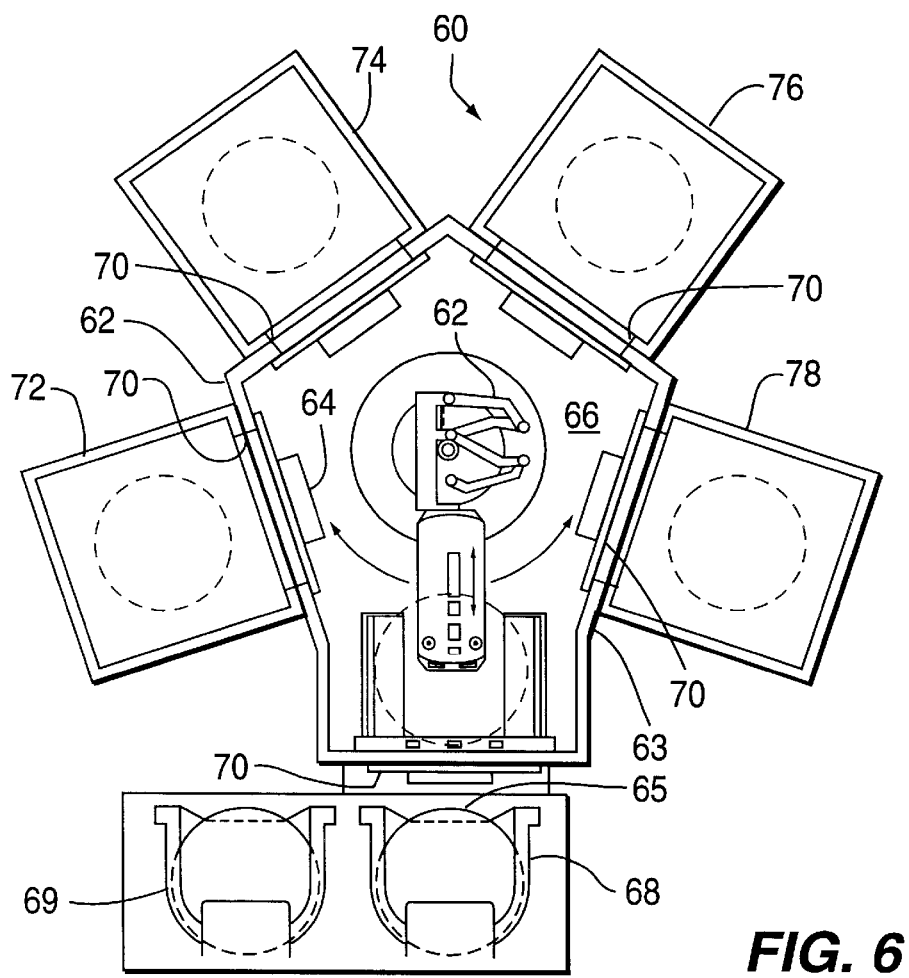
FIG. 6 is a cross sectional schematic view of a multi-chamber vacuum system for sequential processing steps.

It is preferred that the deposition of both titanium layers and titanium nitride layers as well as the plasma oxidation step, be carried out in a single deposition chamber for improved throughput. However, if convenient, these steps can be carried out in separate chambers. The total process can be carried out in a multichamber system as described in U.S. Pat. No. 4,951,601 to Maydan et al as shown in FIG. 6. This patent is incorporated herein by reference.

Referring to FIG. 6, a system 60 includes an enclosed main housing 62 having sidewalls 63 that define an enclosed vacuum load lock chamber 64. A central transfer chamber 66 includes a robot 62 that can take substrates 65 into and out of the system from external load lock chambers 68 and 69. The central transfer chamber 66 is also connected via a plurality of slit valves 70 to a plurality of processing chambers 72, 74, 76 and 78. The robot 62 can transfer wafers from one processing chamber to another, as required. In the present case two of the chambers 72, 74, 76 and 78 can be sputtering chambers, one for sputtering titanium and titanium nitride and the other for sputtering aluminum.

The advantage of the present process is that all of the depositions and plasma treatment of titanium-containing layers can be carried out in a single chamber, without the need for an annealing step in a separate chamber, or for breaking vacuum in the sputtering chamber. The whole contact deposition can be carried out in a dual chamber system, comprising two sputtering chambers, one for the titanium depositions, and the other for sputtering aluminum. This produces a low cost process. Still further, the barrier integrity of the resultant barrier layer-aluminum contact is improved over the state of the art contacts. In particular, we have shown that an oxygen plasma treatment of the titanium layer is more effective to improve barrier properties than stuffing the titanium nitride layer to obtain a low resistivity aluminum contact.

Although the present invention has been described in terms of particular embodiments, one skilled in the art will know how to vary parameters of deposition and the like, and such variations are meant to be included herein. The invention is meant to be limited only by the scope of the appended claims.

I claim:

1. A process for depositing a titanium nitride barrier layer in a sputtering chamber comprising the steps of
   a) sputter depositing a titanium layer onto an exposed surface of a substrate,
   b) forming a titanium oxide layer over the titanium layer and
   c) sputter depositing a titanium nitride layer thereover.

2. A process according to claim 1 wherein the titanium oxide layer is formed by adding an oxygen-containing gas to said sputtering chamber.

3. A process according to claim 1 wherein said titanium oxide layer is formed by sputtering titanium in the presence of an oxygen-containing gas.

4. A process according to claim 3 wherein said oxygen-containing gas is a mixture of oxygen and argon.

5. A process according to claim 1 wherein after the formation of the titanium oxide layer, sputtering is continued in the same chamber to deposit titanium nitride.

6. A process according to claim 1 wherein the formation of the titanium oxide layer is continued until the titanium oxide layer is deposited that is up to about 20 angstroms in thickness.

7. A process according to claim 1 wherein oxygen is added to argon during the titanium layer sputtering step.

8. A process according to claim 5 wherein nitrogen is added to argon during the titanium nitride sputtering step.

9. A process according to claim 1 wherein steps a), b) and c) are performed in a single sputtering chamber.

10. A process according to claim 1 wherein steps a) and b) are performed in one sputtering chamber and step c) is performed in a second sputtering chamber.

11. A process according to claim 1 wherein step a) is performed in one sputtering chamber and steps b) and c) are performed in a second sputtering chamber.

12. A process according to claim 1 wherein aluminum is sputtered over the titanium nitride layer.

* * * * *